(12) United States Patent
Xu

(10) Patent No.: US 10,621,076 B2
(45) Date of Patent: Apr. 14, 2020

(54) METHODS FOR CONTROLLING MOBILE PHONES AND INSTRUMENTS AND SYSTEMS USING THE SAME

(71) Applicant: Intel Corporation, Santa Clara, CA (US)

(72) Inventor: Haibo Xu, Hangzhou (CN)

(73) Assignee: Apple Inc., Cupertino, CA (US)

( * ) Notice: Subject to any disclaimer, the term of this patent is extended or adjusted under 35 U.S.C. 154(b) by 222 days.

(21) Appl. No.: 15/183,980

(22) Filed: Jun. 16, 2016

(65) Prior Publication Data

US 2017/0019514 A1  Jan. 19, 2017

(30) Foreign Application Priority Data

Jul. 14, 2015 (CN) .......................... 2015 1 0412278

(51) Int. Cl.
  *G06F 11/36* (2006.01)
  *G06F 11/22* (2006.01)
  *G06F 13/42* (2006.01)

(52) U.S. Cl.
  CPC ...... *G06F 11/3688* (2013.01); *G06F 11/2221* (2013.01); *G06F 13/4282* (2013.01)

(58) Field of Classification Search
  CPC ............. G06F 11/2221; G06F 11/3688; G06F 13/4282
  See application file for complete search history.

(56) References Cited

U.S. PATENT DOCUMENTS

| | | | | |
|---|---|---|---|---|
| 4,617,663 A * | 10/1986 | Lake | ............... | G06F 11/3684 714/32 |
| 6,463,552 B1 * | 10/2002 | Jibbe | ............... | G06F 9/45512 714/33 |
| 2002/0035404 A1 * | 3/2002 | Ficco | ............... | H04L 12/2803 700/65 |
| 2006/0136579 A1 * | 6/2006 | Linville | ............... | G06F 11/3688 709/223 |
| 2008/0320181 A1 * | 12/2008 | Lauterbach | ......... | G06F 9/4416 710/38 |
| 2009/0015846 A1 * | 1/2009 | Erfling | ............... | G01B 11/024 356/602 |
| 2010/0099396 A1 * | 4/2010 | Huq | ............... | H04L 67/125 455/420 |
| 2011/0195699 A1 * | 8/2011 | Tadayon | ............ | H04B 5/0062 455/418 |
| 2013/0007520 A1 * | 1/2013 | Giammarresi | ...... | G06F 11/2294 714/32 |
| 2014/0225590 A1 * | 8/2014 | Jacobs | ............... | G01R 23/16 324/76.19 |
| 2016/0142391 A1 * | 5/2016 | Maegawa | ............ | G06F 21/44 726/4 |

\* cited by examiner

*Primary Examiner* — Eric T Oberly
(74) *Attorney, Agent, or Firm* — Eschweiler & Potashnik, LLC

(57) ABSTRACT

Embodiments of the invention propose a method for mobile phone and instrument control a system using the method. The method for mobile phone and instrument control is performed by a processing unit and comprises the following steps: reading one script; determining what a destination is according to the script; if the destination is a mobile phone, transmitting a first control command to the mobile phone according to the script; and if the destination is one of a plurality of instruments, transmitting a second control command to the instrument according to the script.

20 Claims, 5 Drawing Sheets

METHODS FOR CONTROLLING MOBILE PHONES AND INSTRUMENTS AND SYSTEMS USING THE SAME

TECHNICAL FIELD

The present invention relates to a control technology, and particularly to a method for mobile phone and instrument control and a system using the method.

BACKGROUND

When a mobile phone is under test, instruments, for example, an integrated tester, a spectrum analyzer, a power supplier and a signal emitter, etc. are need to complete the test program. Conventionally, a script tool can only be connected to one of a mobile phone and an instrument for automatic control, while the other needs to be manually controlled. Therefore, there is a need for a method for mobile phone and instrument control and a system using the method to improve the above-mentioned issue.

SUMMARY

An embodiment of the present invention proposes a method for mobile phone and instrument control performed by a processing unit, the method comprising the following steps: reading a script; determining what a destination is according to the script; if the destination is a mobile phone, transmitting a first control command to the mobile phone according to the script; and if the destination is one of a plurality of instruments, transmitting a second control command to the instrument according to the script.

An embodiment of the present invention proposes a mobile phone and instrument control device, the device comprising at least a storage device and a processing unit. The storage device stores a script text. The processing unit coupled to the storage device reads a script from the script text; determines what a destination is according to the script; if the destination is a mobile phone, transmits a first control command to the mobile phone according to the script; and if the destination is one of a plurality of instruments, transmits a second control command to the instrument according to the script.

DETAILED DESCRIPTION OF THE INVENTION

The following illustrations are preferred implementations of the present invention, with a purpose of describing the basic spirit of the present invention, instead of limiting the present invention. Reference must be made to the scope of the appended claims for actual contents of the invention.

It has to be appreciated that the terms such as "comprise" and "include" as used in the present description are used to indicate the presence of specific technical features, numerical values, method steps, action processing, elements and/or assemblies, but those terms do not exclude the addition of more technical features, numerical values, method step, action processing, elements, assemblies or any combinations thereof.

The terms such as "first", "second", "third" as used in the claims are used to define elements in the claims so as to merely distinguish the elements with the same name, and not to indicate any priority order or precedence relationship therebetween, one element preceding another, or a time sequence of implementing method steps.

Figure 1:
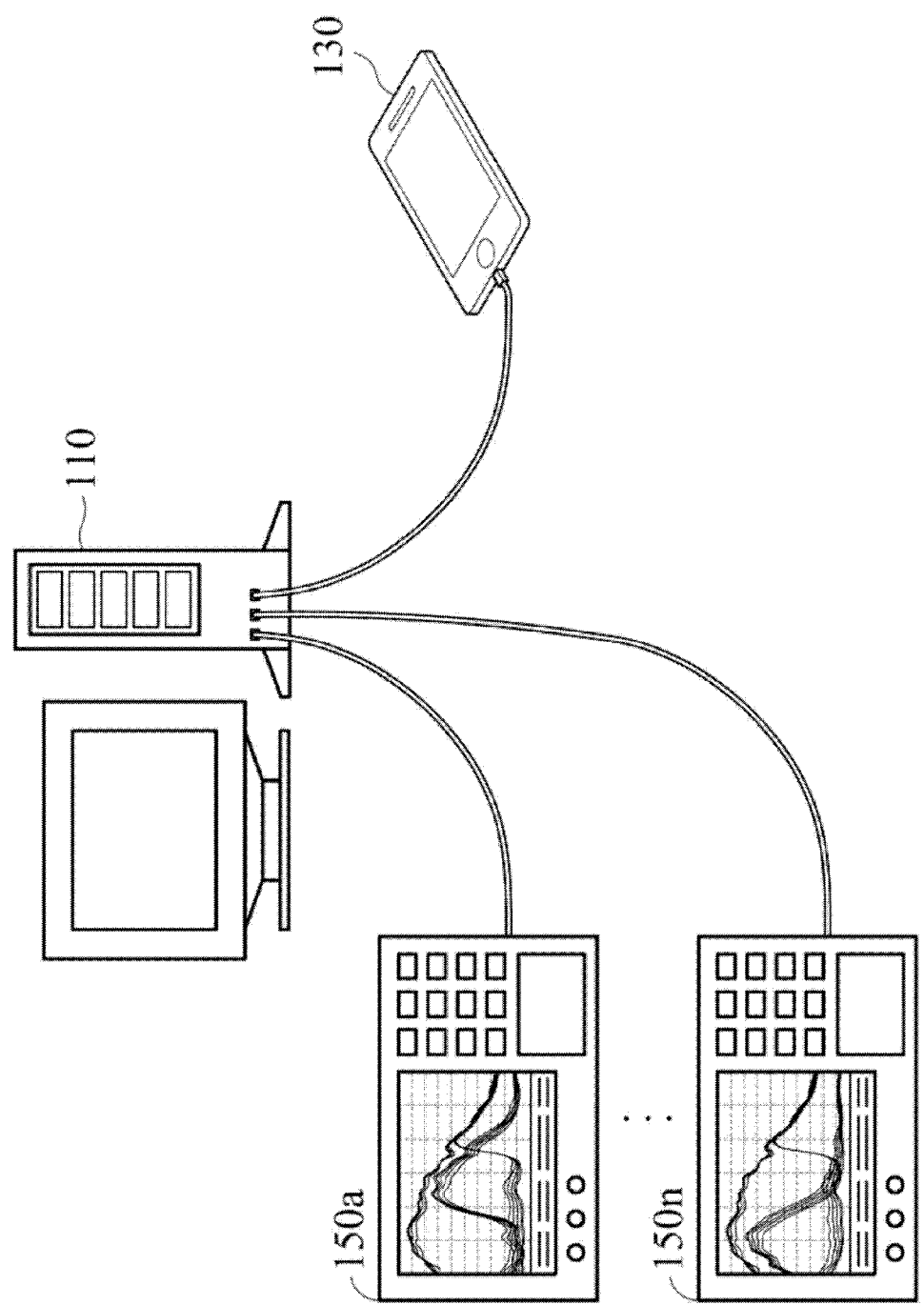
FIG. 1 is a schematic diagram of a system architecture according to an embodiment of the present invention.

An embodiment of the present invention proposes a system architecture for providing a testi for a mobile phone, the system architecture comprising a controller 110, a mobile phone 130 and one or more instruments 150a to 150n. FIG. 1 is a schematic diagram of a system architecture according to an embodiment of the present invention. The controller 110 may be connected to the mobile phone 130 via a Universal Serial Bus (USB) and connected to the one or more instruments 150a to 150n via a General-Purpose Instrumentation Bus (GPIB), for transmitting a command to the mobile phone 130 and the instruments 150a to 150n, respectively. The instruments 150a to 150n may be integrated testers, spectrum analyzers, power suppliers, or signal emitters, and the like. One of the instruments 150a to 150n may be connected to the mobile phone 130. As an example, the instrument may be a power supplier connected to the mobile phone 130 for powering on/off the mobile phone. As another example, the instrument may be a spectrum analyzer for detecting radio-frequency signals transmitted from the mobile phone 130. As still another example, the instrument may be an integrated tester connected to the mobile phone 130 for detecting digital or analog signals output by the mobile phone 130. As yet another example, the instrument may be a signal emitter for transmitting radio-frequency signals to the mobile phone 130.

Figure 2:
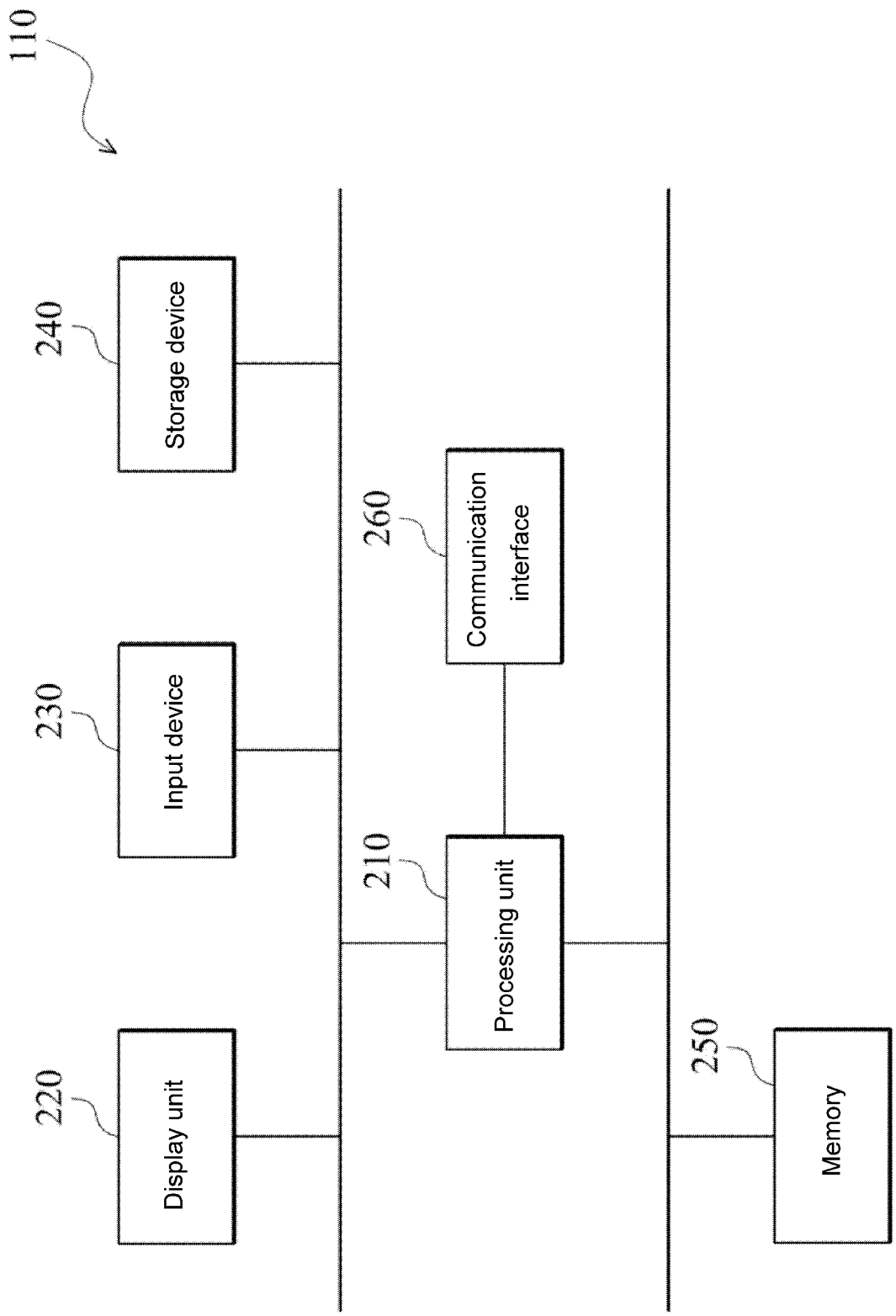
FIG. 2 is a diagram of a system architecture of a controller according to an embodiment of the present invention.

FIG. 2 is a diagram of a system architecture of the controller 110 according to the embodiment of the present invention. This system architecture may be implemented in a desktop computer, a notebook computer or other computer devices, and at least comprises a processing unit 210. The processing unit 210 may be implemented in various manners, for example, in a special purpose hardware circuit or a general purpose hardware, e.g., a single processor, a multi-processor having a parallel processing capability, a graphics processor or other processors having computing capabilities, and provides functions described subsequently when executing program codes or software. The system architecture further comprises a memory 250 for storing data, eg. variables, data tables and playlists, required in the the process of execution and a storage unit 240 for storing various electronic files such as webpages, texts, audio files and video files. The system architecture further comprises a communication interface 260, through which the processing unit 210 may communicate with other electronic devices. The communication interface 260 may include a universal serial bus controller and a general-purpose instrumentation bus controller. An input device 230 may include a keyboard, a mouse, or a touch panel, and the like. A user may press hard keys on a keyboard to enter characters, control a mouse through an operation thereof, or control an application in execution by making gestures on a touch panel. The gestures may include, but not limited to, a single-tap, a double-tap, a single-finger drag and a multi-finger drag, and the like. The display unit 220 may comprise a display panel (for example, a thin-film liquid crystal display panel, an organic light-emitting diode panel or other panels having display capabilities), for displaying input characters, numbers, symbols, moving tracks of a dragged mouse, drawn patterns or pictures presented by an application for a user to view.

Figure 3:
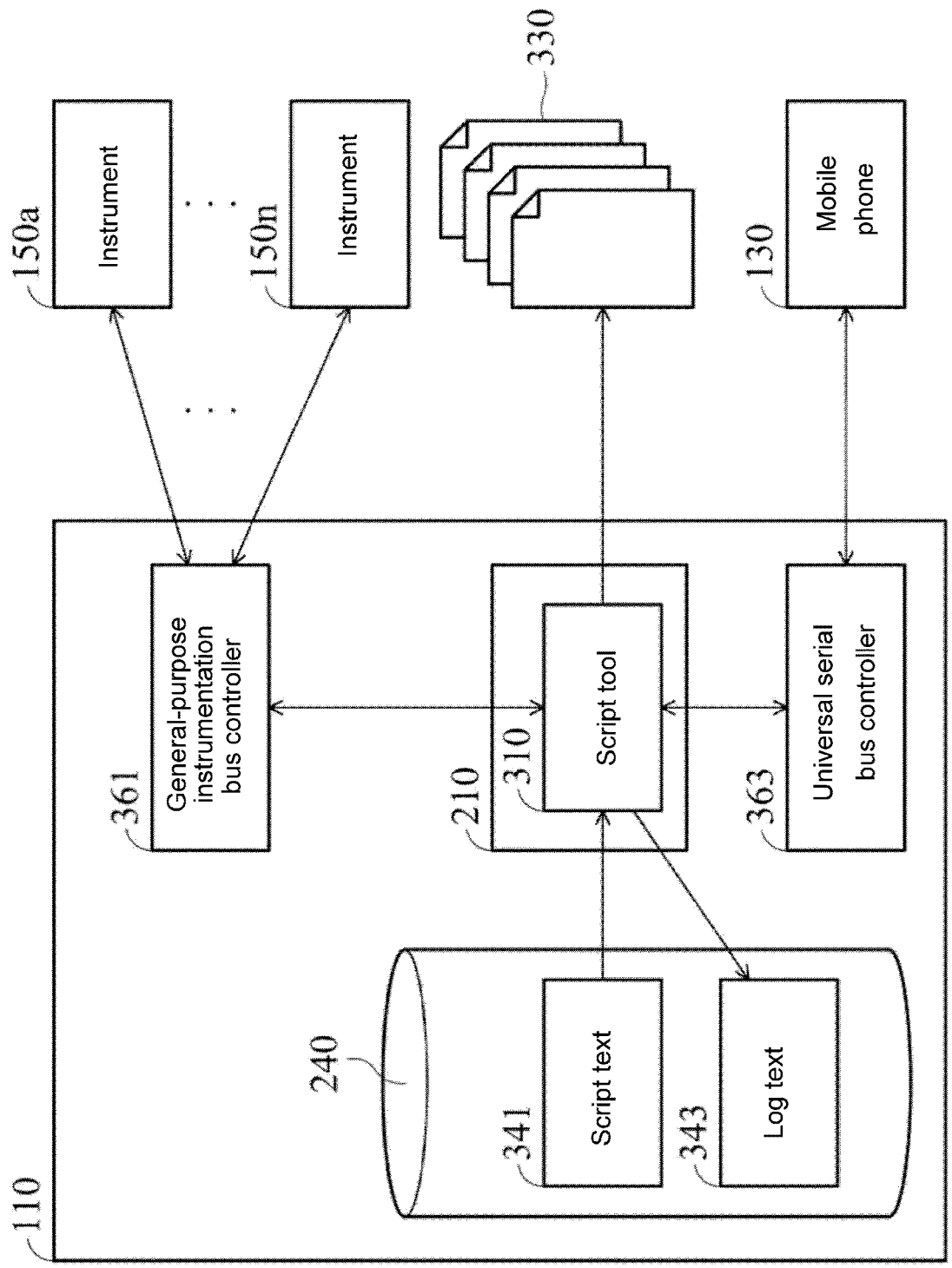
FIG. 3 is a diagram of a system architecture for mobile phone and instrument control according to an embodiment of the present invention.

FIG. 3 is a diagram of a system architecture for mobile phone and an instrument control according to an embodiment of the present invention. The processing unit 210 implements a function of a script tool 310 when loading and executing a related software instruction. The script tool 310 may read a script text 341 from a storage device 240, and transmit a control command to the instruments 150a to 150n via the general-purpose instrumentation bus controller 361 and transmit a control command to the mobile phone 130 via the universal serial bus controller 363 according to a script of the script text 341. The script tool 310 may additionally store the transmission log and messages replied by the instruments 150a to 150n and the mobile phone 130 in the log text 343 in the storage unit 240, display the same on the display unit 220 or print file(s) 330. The script tool 310 may comprise a human-machine interface, through which a required script text is started according to an operation of a user.

Figure 4:
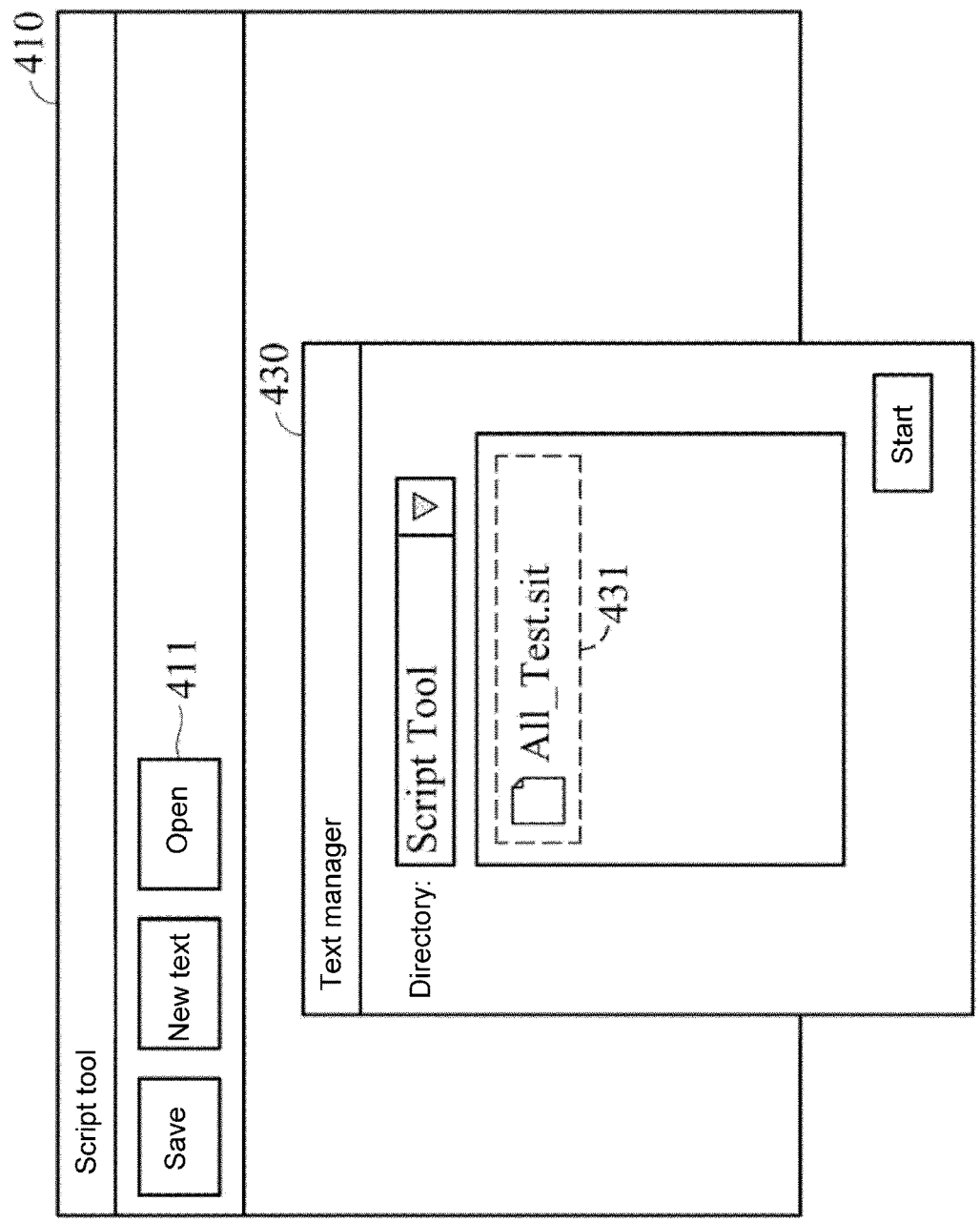
FIG. 4 is a schematic diagram of a human-machine interface according to an embodiment of the present invention.

FIG. 4 is a schematic diagram of a human-machine interface according to an embodiment of the present invention. The human-machine interface comprises a function window 410 displayed on the display unit 220 and comprises a button 411 for activating the function of opening the script text. When detecting that the button 411 is pressed, the processing unit 210 drives the display unit 220 to display a text manager window 430, such that the user can select and open a script text 431 in a text list.

An exemplary script of the script text is shown as follows:
ETS, Id=CP Power, Power=Down
WAIT 500
ETS, Id=CP Init MS Cap Db
WAIT 500
ETS, Id=CP Init Nam
WAIT 500
Database=CP DB PSW MISC, Active NAM=NAM1, \
OpSid Entry for Last System=FALSE, \
Sprint PCS Only Mode=FALSE, \
Prl Enable=TRUE, Pending Registration=PEND_REG_NONE, \
Pref Home MO Service Option=Reset All to default pref,\
Pref Home MT Service Option=Reset All to default pref,\
Pref Roam MT Service Option=Reset All to default pref,\
IS683 NamLock=FALSE
WAIT 500
PS:IDN?
TS:IDN?
Lognote afafafaf
end
loop 2
ETS, Id=CP Power, Power=Down
endloop For example, the processing unit 210 transmits a control command to the mobile phone 130 according to the script "ETS, Id=CP Power, Power=Down", for instructing the mobile phone 130 to power off. The processing unit 210 transmits a control command to the mobile phone 130 according to the scripts "ETS, Id=CP Init MS Cap Db" and "ETS, Id=CP Init Nam", for instructing the mobile phone 130 to perform an initialization action. The processing unit 210 transmits a control command to the power supplier according to the script "PS:IDN?", for inquiring for an identity code. The processing unit 210 transmits a control command to the integrated tester according to the script "TS:IDN?", for inquiring for an identity code.

An exemplary log of the log text is shown as follows:
20:56:32.046<ETS, Id=CP Power, Power=Down
20:56:32.230>OK
20:56:32.656<ETS, Id=CP Init MS Cap Db
20:56:32.894>OK
20:56:33.256<ETS, Id=CP Init Nam
8:56:33 PM.654>OK
20:56:33.675<Database=CP DB PSW MISC, Active NAM=NAM1, OpSid Entry for Last System=FALSE, Sprint PCS Only Mode=FALSE, Prl Enable=TRUE, Pending Registration=PEND_REG_NONE, Pref Home MO Service Option=Reset All to default pref, Pref Home MT Service Option=Reset All to default pref, Pref Roam MT Service Option=Reset All to default pref, IS683 NamLock=FALSE
8:56:34 PM.042>OK
20:56:34.484<PS:IDN?
20:56:34.984>Agilent Technologies, 66319D, MY43002618, A.03.01
20:56:38.465<TS:IDN?
20:56:39.082>Agilent Technologies, 8960Series 10E5515C, MY47512184, B.05.19

Each log comprises information about the time when a control command is transmitted or when a reply message is received. In addition, the symbol "<" represents the transmission of a control command to the mobile phone 130 and one of the instruments 150a to 150n, and the following words shows the control command actually transmitted. The symbol ">" represents the receiving of a reply message from the mobile phone 130 and one of the instruments 150a to 150n, and the following words shows the message actually received.

Figure 5:
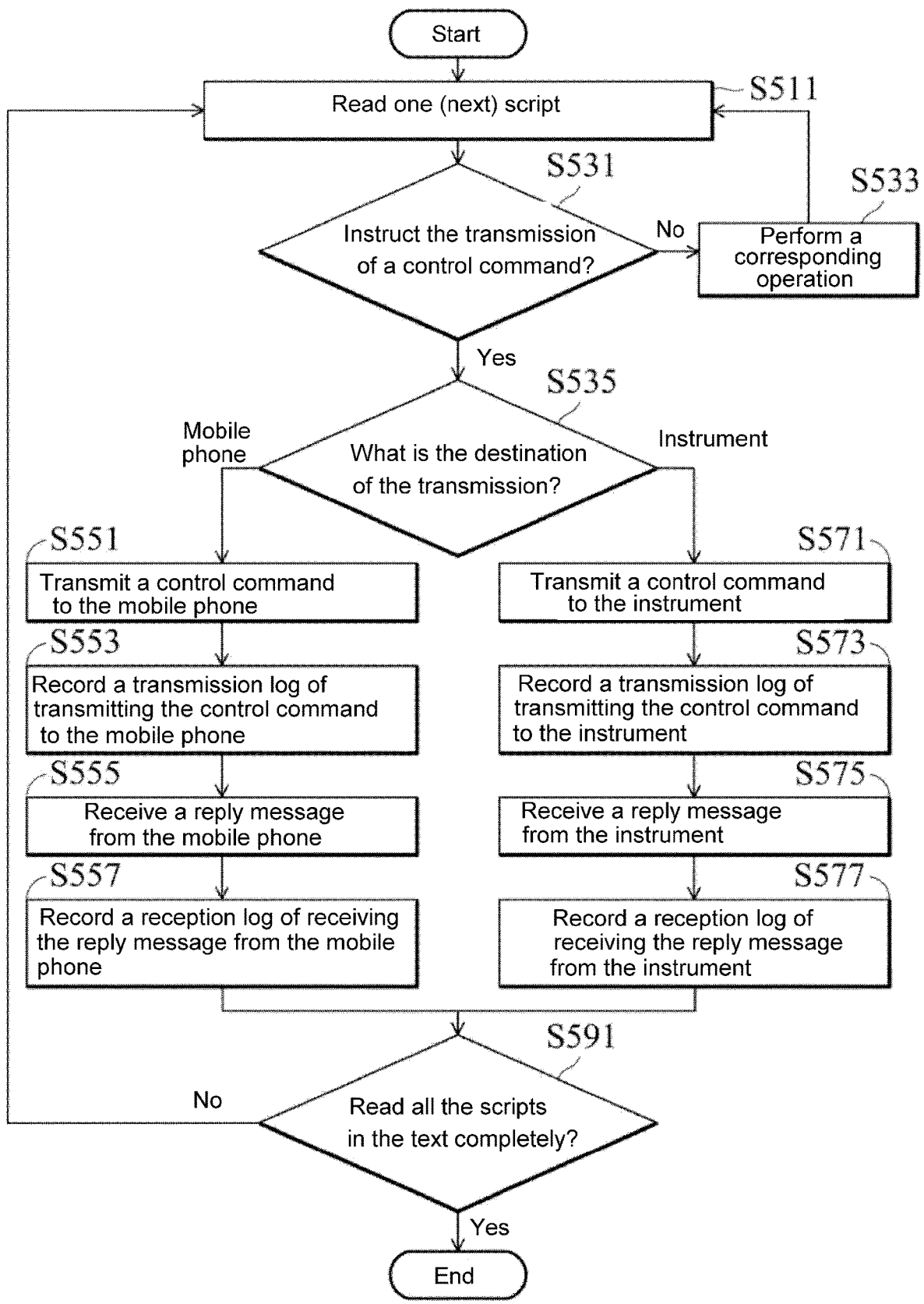
FIG. 5 is a flowchart of a method for mobile phone and instrument control according to an embodiment of the present invention.

FIG. 5 is a flowchart of a method for mobile phone and instrument control according to an embodiment of the present invention. This real-time broadcasting synchronization method is implemented by the processing unit 210 in the controller 110 when the processing unit 210 loads and executes the script tool. In this method, the script in the script text is periodically read, and corresponding operation is performed according to the content of the script. Specifically, after one (next) script is read (step S511), it is determined whether to instruct the transmission of a control command (step S531). If not, a corresponding operation, for example, waiting for a period of time, is performed (step S533). If so, a determination is made as to what the destination of the transmission is (step S535). When the destination of the transmission is a mobile phone (the left path in step S535), a control command is transmitted to the mobile phone 130 via the universal serial bus controller 363 (step S551), and one transmission log of transmitting the control command to the mobile phone 130 is recorded (step S553); and after a reply message is received from the mobile phone 130 via the universal serial bus controller 363 (step S555), one reception log of receiving the reply message from the mobile phone 130 is recorded (step S557). When the destination of transmission is an instrument (the right path in step S535), a control command is transmitted to one of the instruments 150a to 150n via the general-purpose instrumentation bus controller 361 (step S571), and one transmission log of transmitting the control command to the instrument is recorded (step S573); and after a reply message is received from the corresponding instrument via the general-purpose instrumentation bus controller 361 (step S575), one reception log of receiving the reply message from the instrument is recorded (step S577). Finally, the processing unit 210 determines whether all the scripts in the text are read completely (step S591). If so, the entire flow ends; otherwise, continue to read a next script (step S511). It should be noted herein that the transmission log and the reception log as described above may be stored in the log text 343 or displayed on the display unit 220.

Although the elements described above are depicted in FIG. 2, it cannot be excluded that more other additional elements may be used to achieve better technical effects without departing from the spirit of the present invention. In addition, although the flowchart of the method in FIG. 5 is performed in a specific order, persons skilled in the art could modify the order among the steps while achieving the same effects without departing from the spirit of the present invention. Hence, the present invention is not limited to only using the order as described above.

Although the present invention is described with the embodiments above, it should be noted that these descriptions are not intended to limit the present invention. Instead, the present invention encompasses modifications and similar settings apparent to persons skilled in the art. Hence, the scope of the claims of the present application should be construed in the broadest way so as to cover all the apparent modifications and similar settings.

The invention claimed is:

1. A method for mobile phone and instrument control performed by a processing unit of a standalone controller, the method comprising:
    reading, via the standalone controller, a set of scripts contained within a script text;
    determining, via the standalone controller, for each script from among the set of scripts, (i) script content associated with a control command transmission, and (ii) a destination of the control command transmission according to the respective script, the destination being one of (i) a mobile phone, or (ii) one of a plurality of instruments, the mobile phone and the one of the plurality of instruments being simultaneously connected to the controller via a first connection and a second connection, respectively, as the set of scripts are read;
    when the destination of the control command transmission is the mobile phone, transmitting the control command directly to the mobile phone via the first connection according to the respective script via a first bus controller associated with the standalone controller; and
    when the destination is one of the plurality of instruments, transmitting the control command directly to the one of the plurality of instruments via the second connection according to the respective script via a second bus controller associated with the standalone controller,
    wherein the first bus controller and the second bus controller are associated with different communication standards,
    wherein additional scripts are read upon completion of the transmission of the control command to one of the mobile phone or the one of the plurality of instruments until each script from among the set of scripts is read,
    wherein the one of the plurality of instruments is one of (i) an integrated tester, connected to the mobile phone, and configured to detect digital or analog signals output by the mobile phone, (ii) a power supplier configured to power the mobile phone on and off, or (iii) a signal emitter configured to transmit radio-frequency signals to the mobile phone, and
    wherein the one of the plurality of instruments uses the transmitted control command received via the second connection to test the mobile device.

2. The method for mobile phone and instrument control of claim 1,
    wherein the first bus controller is a universal serial bus controller, and
    wherein the second bus controller is a general-purpose instrumentation bus controller.

3. The method for mobile phone and instrument control of claim 1, further comprising:
    recording a first transmission log associated with transmitting the control command to the mobile phone; and
    after receiving a first reply message from the mobile phone, recording a first reception log associated with receiving the first reply message.

4. The method for mobile phone and instrument control of claim 3, further comprising:
    storing or displaying the first transmission log and the first reception log.

5. The method for mobile phone and instrument control of claim 3, further comprising:
    recording a second transmission log associated with transmitting the control command to one of the plurality of instruments; and
    after receiving a second reply message from the one of the plurality of instruments, recording a second reception log associated with receiving the second reply message.

6. The method for mobile phone and instrument control of claim 5, further comprising:
    storing or displaying the second transmission log and the second reception log.

7. A mobile phone and instrument control device including a standalone controller, the mobile phone and instrument control device comprising:
    a storage device configured to store, via the standalone controller, a script text including a set of scripts; and
    a processing unit coupled to the storage device, the processing unit configured to, via the standalone controller:
        read each script from among the set of scripts included in the script text;
        determine, for each script from among the set of scripts associated with a control command transmission, (i) script content associated with a control command transmission, and (ii) a destination of the control command transmission according to the respective script, the destination being one of (i) a mobile phone, or (ii) one of a plurality of instruments, the mobile phone and the one of the plurality of instruments being simultaneously connected to the standalone controller via a first connection and a second connection, respectively, as the set of scripts are read;
        when the destination of the control command transmission is the mobile phone, transmitting the control command directly to the mobile phone via the first connection according to the respective script via a first bus controller associated with the standalone controller; and
        when the destination is one of the multiple instruments, transmitting the control command directly to the one of the multiple instruments via the second connection according to the respective script via a second bus controller associated with the standalone controller, wherein the first bus controller and the second bus controller are associated with different communication standards, wherein additional scripts are read upon completion of the transmission of the control command to one of the mobile phone or the one of the plurality of instruments until each script from among the set of scripts is read, wherein the one of the plurality of instruments is one of (i) an integrated tester, connected to the mobile phone, and configured to detect digital or analog signals output by the mobile phone, (ii) a spectrum analyzer configured to detect radio-frequency signals transmitted from the mobile phone, (iii) a power supplier configured to power the mobile phone on and off, or (iv) a signal emitter configured to transmit radio-frequency signals to the mobile phone, and wherein the one of the plurality of instruments uses the transmitted control command received via the second connection to test the mobile device.

8. The mobile phone and instrument control device of claim 7, wherein the first bus controller is a universal serial bus controller, and wherein the second bus controller is a general-purpose instrumentation bus controller.

9. The mobile phone and instrument control device of claim 8, wherein the processing unit records a first transmission log associated with transmitting the first control command to the mobile phone and, after receiving a first reply message from the mobile phone, records a first reception log associated with receiving the first reply message.

10. The mobile phone and instrument control device of claim 9, wherein the processing unit stores or displays the first transmission log and the first reception log.

11. The mobile phone and instrument control device of claim 9, wherein the processing unit records a second transmission log associated with transmitting the second control command to the one of the plurality of instruments and, after receiving a second reply message from the one of the plurality of instruments, records a second reception log associated with receiving the second reply message.

12. The mobile phone and instrument control device of claim 11, wherein the processing unit stores and displays the second transmission log and the second reception log.

13. The method for mobile phone and instrument control of claim 1, further comprising:

when, a script from among the set of scripts is not associated with a control command transmission, performing a corresponding operation according to the respective script.

14. The method for mobile phone and instrument control of claim 13, wherein the operation according to the respective script includes waiting for a period of time as indicated by the respective script.

15. The method for mobile phone and instrument control of claim 1, wherein the control command instructs a device associated with the destination of the control command transmission to perform at least one of powering off, performing an initialization action, or inquiring an identity code.

16. The method for mobile phone and instrument control of claim 1, wherein each script from among the set of scripts indicates a bus controller to be used for the mobile phone or the one of the plurality of instruments.

17. The method for mobile phone and instrument control of claim 1, wherein the act of reading the set of scripts occurs sequentially.

18. The mobile phone and instrument control device of claim 7, wherein the standalone controller is configured to operate in a standalone mode of operation that does not require communication with devices other than the mobile phone and the one of the plurality of instruments that are simultaneously connected to the standalone controller as the set of scripts are read.

19. The method for mobile phone and instrument control of claim 1, wherein the one of the plurality of instruments further includes a spectrum analyzer configured to detect radio-frequency signals transmitted from the mobile phone.

20. The method for mobile phone and instrument control of claim 19, wherein the plurality of instruments includes each of the integrated tester, the spectrum analyzer, the power supplier, and the signal emitter.

* * * * *